United States Patent [19]

Joy

[11] Patent Number: 4,800,387

[45] Date of Patent: Jan. 24, 1989

[54] BORESIGHT CHAMBER ASSEMBLY APPARATUS

[75] Inventor: Edward B. Joy, Stone Mountain, Ga.

[73] Assignee: Logimetrics, Inc., Plainview, N.Y.

[21] Appl. No.: 577,788

[22] Filed: Feb. 7, 1984

[51] Int. Cl.$^4$ ............................................. G01S 7/40
[52] U.S. Cl. .................... 342/165; 342/173; 455/67
[58] Field of Search .............. 343/17.7; 342/165, 173, 342/1; 455/226, 67, 300

[56] References Cited

U.S. PATENT DOCUMENTS

| | | | |
|---|---|---|---|
| 2,840,810 | 6/1958 | Bailey, Jr. ...................... | 342/173 X |
| 3,035,229 | 5/1962 | Guderian et al. .................. | 342/81 |
| 3,229,289 | 1/1966 | Stine . | |
| 3,290,598 | 12/1966 | Thomas .................................. | 342/1 |
| 3,806,943 | 4/1974 | Holloway ........................... | 342/1 X |
| 4,005,425 | 1/1977 | Nagy ..................................... | 342/174 |
| 4,394,659 | 7/1983 | Gellekink ........................ | 342/174 X |
| 4,484,194 | 11/1984 | Arvidsson ........................... | 342/174 |
| 4,507,660 | 3/1985 | Hemming ............................... | 342/1 |
| 4,559,537 | 12/1985 | Pearson, Jr. et al. .................. | 342/99 |
| 4,688,044 | 8/1987 | O'Brien .............................. | 342/160 |

Primary Examiner—Thomas H. Tarcza
Assistant Examiner—John B. Sotomayor
Attorney, Agent, or Firm—Arthur L. Plevy

[57] ABSTRACT

A boresight chamber apparatus employs a near field measurement technique for measuring the amplitude and phase distributions of an antenna under test and then deriving the boresight error from such measurements. The antenna under test is mounted within an anechoic test chamber on a wall of the chamber. Located adjacent the antenna is a near field probe which is moved along a line parallel to the plane of the antenna. The probe, as moved, scans parallel to the surface of the antenna. At prescribed equally spaced points along the line, the amplitude and phase difference between reference signal and the amplitude and phase developed by the antenna is measured. These measured data allow one to calculate the boresight error of the antenna. The probe position is controlled by a computer which also samples the output of the phase comparator at each of the points that the probe is positioned in to thereby derive an accurate representation of the amplitude and phase distributions of the antenna. The boresight error is subsequently calculated by the computer from the measured amplitude and phase data or using only the phase data.

17 Claims, 3 Drawing Sheets

BORESIGHT CHAMBER ASSEMBLY APPARATUS

BACKGROUND OF THE INVENTION

This invention relates to measurement apparatus for antenna patterns in general and more particularly to a near field measurement technique for providing a boresight error.

A boresight only measurement facility is a special class of near field measurement systems in which the primary manifestation is in the measurement of the phase distribution of a near field pattern. An antenna system with zero boresight error with respect to the near field measurement plane would have a constant phase throughout the collimated region of the near field for the sum mode and 180 degree step function for the difference mode. Thus a boresight error manifests itself as a tilt of the phase front and can be determined by a mathematical relationship.

Essentially, the boresight error is the difference between an assumed boresight direction or a mechanical boresight direction and the electrical boresight direction determined from the radiation of the antenna. The use of near field measurement techniques for field antenna pattern determination was developed many years ago. The near field measurement technique became practical over 20 years ago with the advent of phase-/amplitude receivers and with the development of the theoretical basis for probe compensated measurements, sampling and digital computation. The near field measurement techniques have been accepted in the industry and have been used by the military for measuring antenna patterns. The technique has become the NBS standard for gain calibration of microwave antennas.

Near field measurement systems are used not only to determine far field patterns of antennas but are also used to detect fault elements of phased array antennas, phase align phased antennas, focus antennas and boresight antennas. Many of these require the use of only the near field data without the need for far field calulation.

Essentially, all measurement techniques for measuring the far field radiation pattern of an antenna can be used to measure the boresight error of an antenna. These techniques include the elevated outdoor far field range, the ground reflection far field range, the slant far field range, the anechoic chamber far field range, point source compact range, the line source compact range, point source lens range, the planar surface near field range, cylindrical surface near field range and spherical surface near field range. Each of these ranges is capable of complete far field antenna pattern measurement and thus boresight measurement. These techniques as indicated above, require extensive equipment including expensive antenna mounts, receivers pattern recorders and are specifically designed for high accuracy boresight measurement. There are, of course, existing in the prior art several apparatuses specifically designed for high accuracy boresight error measurement which include the far field difference pattern null seeker, far field sum pattern beam straddler and point source, lens assembly. The first two techniques are adapations of the far field antenna pattern measurement technique and thus require extensive equipment and normally a large outdoor or anechoic chamber facility. The third is an adaptation of the point source compact lens technique.

In any event, a near field measurement system has great advantages when compared to other techniques for measuring the boresight error. In such a system one can achieve high accuracy in a relatively small size with an attendant increase in reliability and utilizing accepted techniques. As will be explained, the present system is a near field measurement system which is fully automated and is capable of performing many measurements in a short time. The system can measure a phase distribution with approximately 30 near field measurements in one minute.

BRIEF DESCRIPTION OF THE PREFERRED EMBODIMENT

A boresight chamber assembly apparatus for measuring the boresight characteristics of an antenna, comprising a rectangular housing having an aperture of a given diameter located on a side wall and adapted to accommodate an antenna to be tested, an antenna structure having a base secured to a plate said plate being of a larger diameter than said aperture to enable said antenna to be positioned into the hollow of said housing when said plate is inserted over said aperture, a movable RF probe located in the hollow of said housing and adapted to move parallel to the radiating surface of said antenna, a source of RF energy coupled to said probe for enabling said probe to emit RF radiation and means coupled to said probe to move the same to a plurality of separate postions along a line each parallel to said radiating surface of said antenna, and processing means coupled to said antenna and said RF source for providing outputs indicative of any phase difference between the same with a separate output for each of said separate positions whereby the boresight error of said antenna can be derived from said outputs.

DETAILED DESCRIPTION OF THE FIGURE

Figure 1:
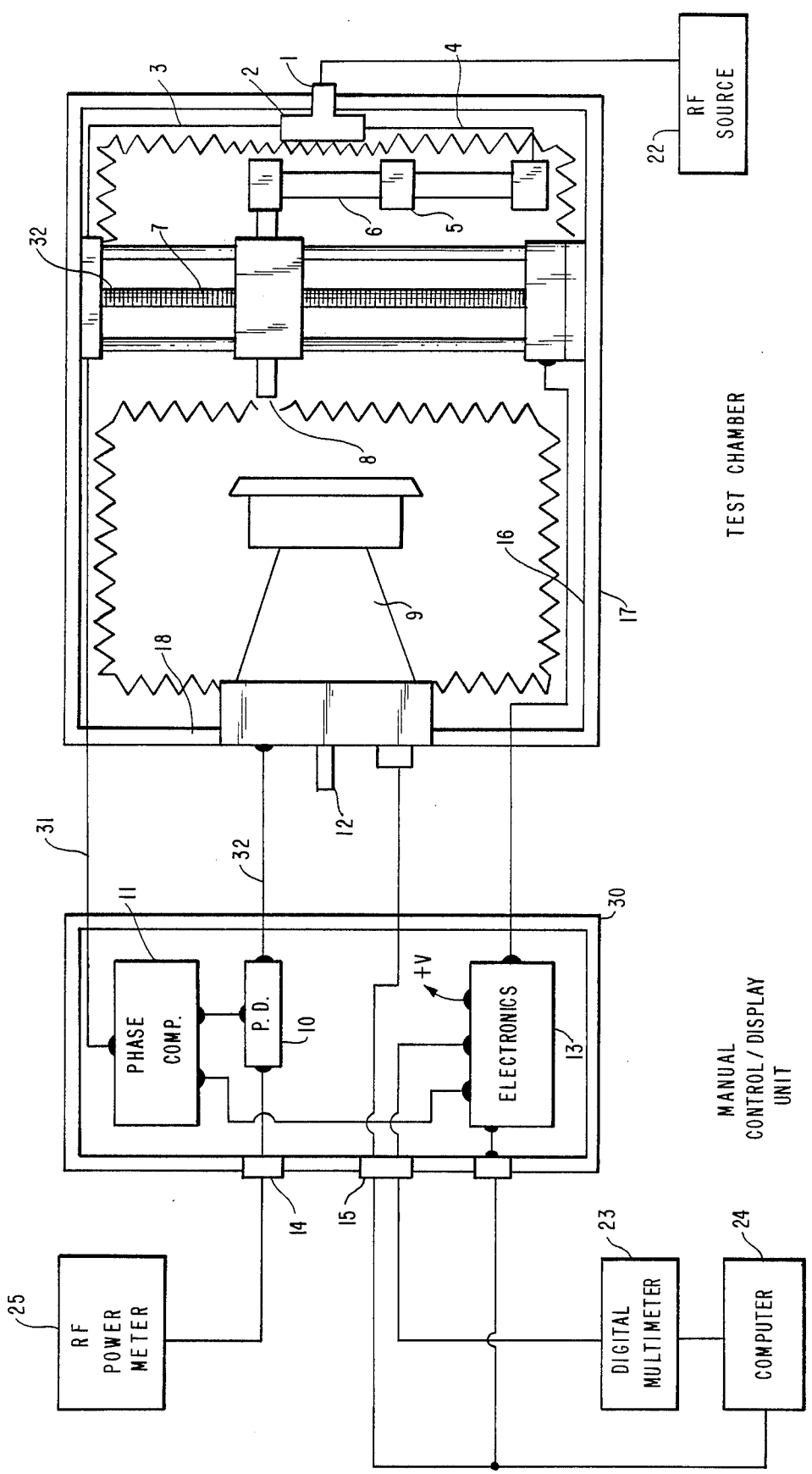
FIG. 1 is a block diagram of a boresight chamber assembly apparatus according to this invention.

Referring to FIG. 1, there is shown a block diagram of. the boresight chamber assembly according to this invention.

Essentially, there is shown a test chamber 17 which consists of a shielded enclosure. The test chamber 17 contains an inner frame 16 which has the components secured thereto. Essentially, the test chamber is approximately 24 inches high by 24 inches deep and 30 inches wide. The test chamber is a structurally rigid unit which contains an inner U-shaped frame 16 The inner frame 16 is enclosed by suitable sheet metal to thereby basically form the test chamber which is a rectangular box. Test chamber 17 is completely lined with an RF absorbing material 19 to prevent any radiation from reflecting from the chamber walls and entering the antenna under test and from leaking out of the test chamber. It is, of course, understood that there are many ways of fabricating such a test chamber.

As will be explained in greater detail, the test chamber essentially contains an input RF connector 1 which is coupled to an input RF power divider 2. Directed from the power divider 2 is a reference signal cable 3 and a measurement signal cable 4. Located within the test chamber are coil semi-rigid cables 5 which cables are connected to a near field probe antenna 8.

The probe antenna 8 can move in the vertical direction under control of a probe positioning unit 7 which will be described in greater detail. Located within the test chamber is an antenna seeker and gimbal system 9 hereinafter referred to as LRU 9.

The LRU 9 is associated with a matched load impedance 12. Located adjacent the test chamber is a manual control/display unit. The unit is also enclosed in a rectangular frame assembly 30 and contains a phase comparator 11 which as will be explained is coupled to the test chamber via a coaxial cable 31. One input of the phase comparator 11 is connected to the output of an RF power divider 10 which receives an input from the test chamber via cable 32. The test chamber also includes a module 13 which is a power supply for furnishing bias to electronic circuitry also included in module 13 and as will be explained. The manual control/display unit also has an output RF connector 14 which enables connection to an RF power meter 25. There is a data/control connector 15 which has one output coupled to a digital multimeter 23 and an input emanating from a computer 24. The digital multimeter, as will be explained, supplies input signals to the computer 24.

Coupled to the test chamber via the input coaxial connector 1 is an RF source 22. The source 22 supplies approximately 20 dBm of RF power at a desired test frequency which frequency is within the range of antenna operation. The RF power from the RF source 22 enters the test chamber through the input coaxial connector 1 which may be a standard steel type N connector. The input power is divided by the input power divider 2 into two paths which, as will be explained, are both directed B to the phase comparator 11 contained in the manual control/display unit. One path from the power divider is the reference path 3 an the other path is the near field measurement path 4. The power divider is a conventional component and many examples of such dividers are commercially available from many different sources The ratio of the power division between the reference path 3 and the near field path 4 is such that the two signals arriving at the phase comparator have approximately the same amplitude. As will be explained, the phase comparator does not require that the two levels be the same as the exact signal level is not critical. The power division ratio from divider 2 is determined using the near field gain of the seeker antenna and associated gimbal system (LRU 9). The seeker antenna and the associated gimbal system (LRU 9) are secured to the test chamber 17 via an externally supplied mounting plate. The test chamber has an aperture for receiving the LRU 9 which is mounted on the side of the test chamber as shown in FIG. 1. The power division ratio is also determined in accordance with the gain of the near field probe 8, the insertion loss of the scissor arm cable assembly 6 and the spatial loss between the probe 8 and the LRU The amplitude and phase reference path 3 is coupled to the comparator 11 by means of the coaxial cable 31 which extends directly from the input power divider 2 to the phase comparator 11. The near field measurement path begins at the input power divider 2 and extends by way of the coaxial cable 4 to the probe postioning unit 7. The signal passes through three, three coil semi-rigid cable 5 which is incorporated into the scissor arm assembly 6 on the probe postion unit 7. The probe position unit 7 is used to move the near field probe 8 vertically in a plane parallel to the phase of the LRU 9. The probe positioning unit 7 is a self-aligned configuration which utilizes preloaded linear bearings. Such devices are well known and are utilized for linearly advancing a mechanism by means of an lead screw 32 which is associated with guides. The guides are normally made of stainless steel and the lead screw 32 is also stainless steel. The lead screw is mounted using high grade threaded bearings. As indicated, such probe positioning units as 7 are commercially available and have been employed in a great many devices. The three point scissor arm assembly 6 is necessary to allow the signal to arrive at the near field probe 8 without introducing amplitude or phase variation as the probe is moved throughout its vertical travel. The scissor arm assembly utilizes two or three turn coils of semi-rigid coaxial cable at each of the three scissor arm points. These coils are used rather than conventional rotary points to provide better high frequency performance and thus improved dependability of phase measurement. The technique of using semi-rigid coils in lieu of rotary points is also well known and has been employed in other systems. Thus the output of the scissor arm assembly signal path is applied to the input of the near field probe 8. The near field probe 8 is a linearly polarized low gain open ended wave guide type antenna positioned approximately three wave lengths from the front of the LRU 9 under test. This broad beam width probe 8 will radiate energy to all elements of the antenna or LRU 9 under test. Therefore, a single scan will provide a complete test of each element in the LRU 9. The near field measurement path signal is radiated from the near field probe 8 and received by the LRU 9. The LRU 9 has two output ports both of which become energized upon receiving the signal radiated from the near field probe. One port is the difference port and the other port is the sum port.

The difference port contains the pattern information relating to the difference pattern null which determines the elevation boresight direction. When determining the elevation boresight error, the difference output port is connected to the directional coupler 10 or RF power divider. The through port of the coupler 10 is applied to one input terminal of the phase comparator 11. The sum output port as shown in the FIG. is terminated in the matched load impedance 12 when not in use. Should it be desired to measure the sum response of the antenna, then the sum output port is connected to the coupler 10 and the difference port is terminated with the matched load impedance 12. The coupler 10 is included to allow the external RF power meter 25 to monitor the amplitude of the receive signal. The power meter 25 may be the HP-436A which is an RF power meter manufactured by the Hewlett-Packard Company of California.

The coupler 10 is connected to a stainless steel type N coaxial connector 14 to facilitate the connection of the power meter to the unit. The ratio of the power divider 10 is approximately 20 db with the largest output directed to the input of the phase comparator 11. The phase comparator 11 compares the received signal output of the LRU 9 to the reference signal from cable 31. Two dc analog signals are produced by the phase comparator. One signal is proportional to the amplitude and the other signal is proportional to the phase of the output of the LRU 9 with respect to the reference signal. By using a phase comparison technique, it is not necessary that the phase of the input signal remain constant since the performance of the LRU 9 is determined by the phase difference between the RF input and the LRU 9 and not the absolute phase. The analog outputs from the phase comparator 11 which are the phase and amplitude signals are directed to the electronic module 13 where they are buffered by conventional amplifier techniques and are then coupled to connector 15 to be applied to the digital multimeter 23. The digital multimeter 23 is a conventional component manufactured by many companies such as the Hewlett-Packard Company and will provide digital output signals relating to amplitude and phase. The output signals directed to connector 15 may also be appropriately scanned to drive suitable display meters whereby a display of amplitude and phase can be obtained directly.

Such meters can provide direct digital readouts which correspond to amplitude and phase. The computer 24 which has outputs coupled to the connector 15 which output signals operate to control the probe position motor to enable movement of the near field probe vertically in the plane perpendicular to and centered on the face of the LRU 9. Essentially, the probe positioning unit 7 contains a drive motor which drives the lead screw 32 based on the magnitude of voltage applied to the motor. The computer will generate a specified number such as 30 of output digital signals which are converted to analog signals by means of a digital-to-analog converter contained in module 13. These analog signals will then drive the probe 8 to approximately 30 equally spaced points along the surface of the LRU 9. At these thirty equally spaced points, the outputs of the phase comparator 11 are sampled and recorded in the computer via the digital multimeter 23. These thirty data points are then used to calculate the boresight direction of the LRU 9 using a conventional algorithm which the computer 24 is programmed to solve and as will be explained. The calculated boresight direction is compared to the specified direction to determine the boresight error of the LRU 9. The digital multimeter 23 and the computer 24 as indicated are connected to the system through a standard multipin connector 15.

The connector 15 is connected via internal cabling to the electronic assembly 13. In regard to the above noted operation, the boresight error manifests itself as a tilt of the phase front and can be determined by the following equation:

$$BSE \text{ (milliradians)} = 1000 \sin^{-1}\left[\frac{\Delta\phi/360}{L/\lambda}\right]$$

Where $\Delta\phi$ is the phase difference in degrees across the collimated region L of the antenna and $\lambda$ is the wavelength. For the case of small boresight error and for an antenna aperture L of 13.9 $\lambda$, this expression reduces to approximately $$BSE \text{ (milliradians)} \approx =0.2\Delta\phi.$$

This expression shows that the phase must be measured to an accuracy of 5 degrees for a boresight error of 1 milliradian. The following error budget for phase measurement is easily achievable with off-the-shelf components.

| Component | Phase Accuracy (Degrees) |
|---|---|
| Phase comparator (single frequency) | ±0.10 |
| Frequency Drift of Phased Locked Source | ±0.01 |
| (1 × 10$^{-8}$/minute) | |
| 3 Rotary Joints | ±0.30 |
| (Each less than 90° rotation) | |
| Temperature Change | ±0.04 |
| (1° C./minute) | |
| Out of Plane Mechanical Accuracy | ±0.25 |
| (±1/1000") | |
| Total | ±0.70 degrees |
| Total Root Square (RSS)* | ±0.41 |

*When several unrelated errors are given, it is customary to express the resultant overall error as a RSS error. Thus the square root of the sum, the square of the individual errors.

Thus it is estimated (based on a total phase accuracy of ±0.7 degrees) that the accuracy of the proposed system is about ±0.14 milliradians. The repeatability of the system is less as the two largest errors (Phase change in Rotary Joints and Mechanical Accuracy) are in most part repeatable.

Thus as one can see from the above expression and FIG. 1, the system allows one to rapidly scan the near field of the antenna (thirty different phase readings at thirty different points) and, therefore, compute the boresight error for the antenna based on the thirty different points. The system utilizes conventional components all standard off-the-shelf units. It is, of course, understood that the computer 24 can be replaced by a mechanical control to thereby mechanically move the probe 8 into a desired number of positions.

The above noted equation can easily be solved by a computer but also can be manually solved or be solved in general by ordinary logic circuitry as the operations indicated by the above equation are simple to implement. Based on the components utilized in such a system, the system described can measure the phase differences with approximately thirty near field measurements taken in one minute.

As indicated above, these measurements are taken by the simultaneous movement of the near field probe and the recording of the near field data under control of the computer. Thus once the LRU 9 is mounted on the test chamber, all measurements and mechanical motion can be carried out without manual intervention.

Figure 2:
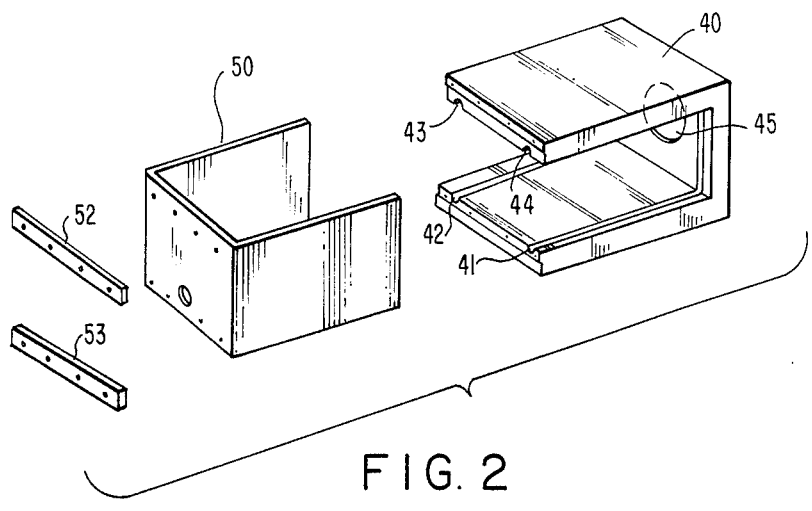
FIG. 2 is a perspective plane view of a test chamber employed in this invention.

In conjunction with the above noted description, the brief description of the mechanical arrangement will be described Referring to FIG. 2, there is shown a perspective view of the test chamber assembly. The test chamber is designed to facilitate normal calibration and maintenance procedures. Essentially, the test chamber consists of two components. A first component 40 is a U-shaped frame member having slots as 41 and 42 on the bottom surface and slots as 43 and 44 on the top surface. The U-shaped member has a front aperture 45 into which the LRU 9 is mounted. The U-shaped inner frame member 40 is formed from a suitable metal and is enclosed by a complementary fitting sheet metal member 50 which slides into the slots as shown and is securely mounted to the unit by means of the sealing plates 52 and 53. The slots or grooves as 41 to 44 are cut into the inner frame and are milled to a depth which is equal to ¼ wave length at the operating frequency. In this manner the grooves act as quarter wave choke sections to effectively seal the test chamber from radiating outwardly. Additional metal textile gasketing and finger stock are used at the mechanic interfaces to substantially reduce the external RF radiation at the frequencies of concern. The inner surface of the frame 40 and the cover 50 are fully lined with RF absorbing material.

As can be seen from the FIG., the U-shaped cover 50 is readily removable from the frame 40. This is accomplished by removing the captive fastening screws from the sealing plates 52 and 53.

Figure 3:
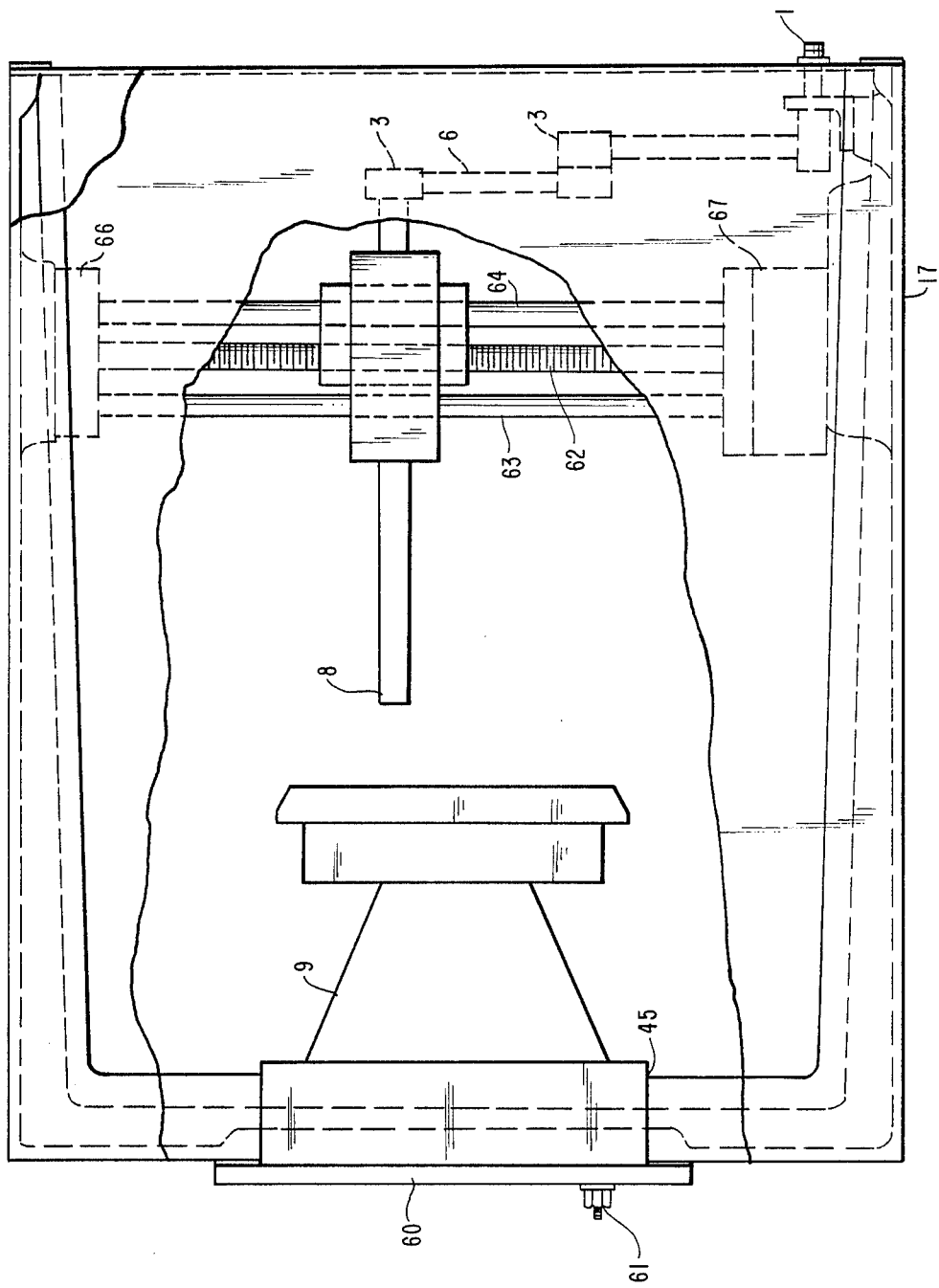
FIG. 3 is a partial sectional view depicting the test chamber together with an antenna system secured thereto.

Referring to FIG. 3, there is shown a cross section view of the test chamber particularly depicting how the LRU is mounted. As indicated, there is an aperture 45 in the test chamber. The LRU is mounted to a mounting plate 60 via suitable bolts as 61. The mounting plate 60 with the LRU attached to it is then inserted through the aperture 45 and bolted to the test chamber via the mounting plate. The mounting plate also contains an RF shield which prevents RF energy from radiating out.

Shown positioned adjacent the LRU is the probe positioning unit. As indicated, the probe positioning unit consists of a lead screw 62 onto which the probe and housing are movably attached Adjacent the lead screws are guides as 63 and 64 which guides are attached to the top of the frame assembly by means of an adjusting block 66. The guides are made of hardened stainless steel as is the lead screw. The entire unit as shown is available from many manufacturers.

The motor 67 is a dc motor which engages the lead screw 62 to allow the probe to move parallel to the front surface of the LRU.

Figure 4:
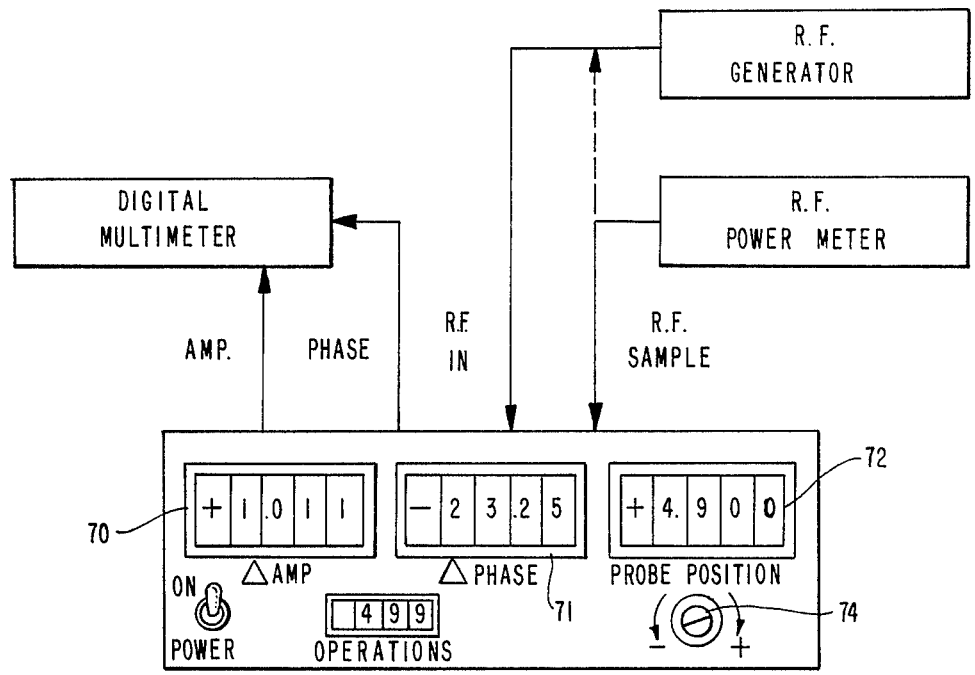
FIG. 4 is a block diagram showing a control/display for the boresight chamber assembly.

Referring to FIG. 4, there is shown a panel display which is employed with the manual control/display unit. The panel display can be employed for manual operation and has three meters located on the front. The first meter 70 displays the amplitude of the RF signal while the second meter 71 displays the phase. The meter 72 is calibrated so that it gives a direct readout of the probe position. When the probe is at the center of the antenna, the meter 72 reads zero and when the probe is at the top of the antenna it reads directly in inches from the center as +4.9 as shown in the FIG. When the probe is an equivalent number of inches beneath the center, the meter 72 will read, for example, −4.9. The use of such meters in conjunction with the digital multimeter and RF power meter are well known and many examples of such devices are commercially available. In any event, during manual operation, the travel of the probe is controlled by means of the knob 74 which will activate the motor and cause the motor to move the probe while at the same tim the distance the probe moves is automatically displayed via the meter 72. In the automatic operation of the equipment as shown in FIG. 1, the computer 24 is programmed to allow the test to be automatically conducted. The computer generates a series of digital signals which are converted via a digital-to-analog coverter contained in the electronics package 13 to control the motor and, therefore, to position the probe at a plurality of desired postions. At each of the positions as controlled by the computer, the samples of the amplitude and phase different measurements are taken. The computer software is set up so that it samples the data at fixed intervals and stores this data in memory. At the completion of a scan, the boresight algorithm checks the data for any gross errors. If any gross errors exist, the operator is informed and given the option of halting the test or allow the algorithm to complete its process. At the completion of the process, the operator can then have the computer print out the data and determine whether the LRU under test meets the requirements or not. The computer is programmed to solve the above noted equation as the probe is scanning the antenna.

I claim:

1. A boresight chamber assembly apparatus for measuring the boresight characteristics of an antenna, comprising:
   a rectangular housing having an aperture of a given diameter located on a sidewall and adapted to accommodate an antenna to be tested,
   an antenna structure having a base secured to a plate said plate being of a larger diameter than said aperture to enable said antenna to be positioned into the hollow of said housing when said plate is inserted over said aperture,
   a moveable RF near field probe located in the hollow of said housing and adapted to move parallel to the radiating surface of said antenna, said probe being a linearly polarized low gain open ended waveguide antenna positioned at a given distance from said antenna radiating surface,
   a source of RF energy coupled to said probe for enabling said probe to emit RF radiation with said RF source generating a given wavelength where said given distance of said probe is at three wavelengths of said RF wavelength, and
   means coupled to said probe to move the same to a plurality of separate positions each parallel to said radiating surface of said antenna, and
   processing means coupled to said antenna and said RF source for providing outputs indicative of any phase differences between the same with a separate output for each of said separate positions whereby the boresight error of said antenna can be derived from said outputs.

2. The boresight chamber assembly apparatus according to claim 1 wherein said processing means includes a a phase comparator having one input coupled to an output port of said source of RF energy to provide at an output a signal indicative of the phase difference and means coupled to said output of said phase comparator for providing a display of the magnitude of said signal.

3. The boresight chamber assembly apparatus according to claim 2, wherein said output port of said antenna is the difference port.

4. The boresight chamber assembly apparatus according to claim 2, wherein said output port of said antenna is the sum port.

5. The boresight chamber assembly apparatus according to claim 1 wherein said means coupled to said probe to move the same includes a lead screw located in said housing and arranged parallel to the radiating surface of said antenna, with said probe coupled to said lead screw and adapted to move as said screw rotates and means coupled to said screw for rotating the same.

6. The boresight chamber assembly apparatus according to claim 5, wherein said means coupled to said screw comprises a motor.

7. The boresight chamber assembly apparatus according to claim 1, wherein said processing means includes a computer adapted to receive at inputs thereof digital information indicative of said phase differences for deriving said boresight error from said outputs.

8. A method measuring the boresight error of an antenna comprising the steps of:
   (a) mounting an antenna to be tested within a test chamber,
   (b) moving a linearly polarized low gain open ended waveguide antenna probe along an axis parallel to the radiating surface of said antenna, with said axis being three wavelengths of an RF source from said radiating surface of said antenna, (c) exciting said probe with a source of RF energy at a given wavelength, (d) comparing the phase of the RF energy emitted by said antenna with the phase emitted by said RF source as energized by said probe at a plurality of points along said axis, to determine any difference in phase, (e) calculating the boresight error from said comparisons made at said plurality of points.

9. The method of measuring the boresight error according to claim 8, wherein the step of calculating includes solving the following equation:

$$BSE = 1000 \sin^{-1}\left[\frac{\Delta\phi/360}{L/\lambda}\right] \text{(milliradians)}$$

where $\Delta\phi$ = the difference in phase (Degrees)
L = collimated region of the antenna (Meters)
$\lambda$ = wavelength of RF source (Meters)
BSE = boresight error (Milliradians)

10. The method according to claim 8 wherein the step of moving said probe comprises mounting said probe on a rotating lead screw to move said probe as said lead screw is rotated and rotating said lead screw.

11. The method according to claim 8, further including the step of storing said differences in phase in a memory.

12. A boresight chamber assembly for measuring the characteristics of an antenna, comprising:

a test chamber having positioned therein an antenna with said antenna having a major axis directed along the horizontal plane, with a radiating surface relatively perpendicular to said axis, a moveable probe means positioned perpendicular to said horizontal axis and adapted to move the vertical plane, said probe being a linearly polarized low gain open ended waveguide antenna and spaced from the radiating surface of said antenna at a given distance, an RF source for providing an RF signal, means coupled to said source for developing a first signal coupled to said probe and a second reference signal, with said RF source operating at a given wavelength, where said given distance of said probe is at three wavelengths of said RF source, a second chamber having positioned therein a phase comparator having first and second inputs and an output, means coupling an output of said antenna to one input of said phase comparator, and means coupling said reference signal to said other input of said phase comparator, to provide at said output of said comparator a signal indicative of the phase difference, a digital multimeter coupled to said second chamber and adapted to receive said output of said phase comparator to provide a digital indication of said phase difference to enable the calculation of the boresight error associated with said antenna.

13. The boresight chamber assembly according to claim 12, wherein said test chamber has an aperture on a vertical sidewall with said antenna mounted to a base plate having a greater diameter than said aperture to allow said antenna to be inserted via said aperture into the hollow of said test chamber with said base plate secured to said sidewall.

14. The boresight chamber assembly apparatus according to claim 12, wherein said test chamber is shielded to prevent leakage of RF energy.

15. The boresight chamber assembly apparatus according to claim 12, wherein said test chamber consists of a first U-shaped section having a vertical backwall and a top and a bottom wall forming the arms of said U with said top and bottom walls having inner elongated slots directed from one end to the other, a second U-shaped section having a vertical sidewall and first and second sidewalls forming the arms of said U and adapted to slide into said slots of said first section to form a closed box-like chamber section.

16. The boresight chamber assembly apparatus according to claim 15 wherein said slots are dimensioned such that the depth of each slot is approximately equal to one quarter wavelength at the frequency of said RF signal.

17. The boresight chamber assembly according to claim 12, wherein said probe means includes a vertical lead screw coupled to said probe and adapted when rotated to cause said probe to move along the vertical axis to enable said probe to direct energy at said antenna along the radiating length of said antenna.

* * * * *